US010355626B2

(12) United States Patent
Braun (10) Patent No.: US 10,355,626 B2
(45) Date of Patent: Jul. 16, 2019

(54) CIRCUIT FOR CONTROLLING SLEW RATE OF A HIGH-SIDE SWITCHING ELEMENT

(71) Applicant: RENESAS ELECTRONICS EUROPE GMBH, Duesseldorf (DE)

(72) Inventor: Hans-Juergen Braun, Duesseldorf (DE)

(73) Assignee: RENESAS ELECTRONICS EUROPE GMBH, Duesseldorf (DE)

( * ) Notice: Subject to any disclaimer, the term of this patent is extended or adjusted under 35 U.S.C. 154(b) by 0 days.

(21) Appl. No.: 15/328,608

(22) PCT Filed: Jul. 23, 2015

(86) PCT No.: PCT/EP2015/066912
§ 371 (c)(1),
(2) Date: Jan. 24, 2017

(87) PCT Pub. No.: WO2016/012553
PCT Pub. Date: Jan. 28, 2016

(65) Prior Publication Data
US 2017/0214342 A1 Jul. 27, 2017

(30) Foreign Application Priority Data

Jul. 24, 2014 (EP) .................................. 14178290

(51) Int. Cl.
*H02P 1/30* (2006.01)
*H02P 1/52* (2006.01)
(Continued)

(52) U.S. Cl.
CPC .................. *H02P 6/14* (2013.01); *H03K 5/04* (2013.01); *H03K 17/166* (2013.01); *H03K 2217/0036* (2013.01); *H03K 2217/0063* (2013.01)

(58) Field of Classification Search
CPC .................................... H02P 6/14; H03K 5/04
(Continued)

(56) References Cited

U.S. PATENT DOCUMENTS 5,796,276 A * 8/1998 Phillips ................ H03K 17/063
323/315
6,072,289 A * 6/2000 Li .......................... G11B 19/20
318/400.19
(Continued)

OTHER PUBLICATIONS

Extended Search Report and Written Opinion of corresponding European application No. 14178290.4 dated Jan. 21, 2015, all enclosed pages cited.
(Continued)

*Primary Examiner* — Erick D Glass
(74) *Attorney, Agent, or Firm* — Burr Forman McNair (57) ABSTRACT

A circuit (11) for controlling slew rate of a high-side switching element (6) in a load switch (5) is described. The circuit includes a variable current source (20) for setting a slew rate. The circuit also includes an amplifier (15) comprising a first input coupled to a fixed voltage source (19), a second input coupled to the variable current source and an output (18) for a drive signal. A feedback path (26) from an input terminal (13), connected or connectable to an output (14) of the switching element, to the second input of the amplifier, includes a series voltage-differentiating element, such as a capacitor (27).

20 Claims, 5 Drawing Sheets

(51) Int. Cl.
  *H02P 3/00* (2006.01)
  *H02P 7/06* (2006.01)
  *H02P 6/14* (2016.01)
  *H03K 5/04* (2006.01)
  *H03K 17/16* (2006.01)

(58) Field of Classification Search
  USPC .......................................................... 318/503
  See application file for complete search history.

(56) References Cited

U.S. PATENT DOCUMENTS

| | | | |
|---|---|---|---|
| 6,194,935 B1* | 2/2001 | Pioppo | H03K 17/163 327/103 |
| 8,331,072 B1* | 12/2012 | Liu | H03F 1/52 361/93.7 |
| 9,621,138 B1* | 4/2017 | Zhang | H03K 3/353 |
| 2004/0090253 A1 | 5/2004 | McNitt et al. | |
| 2008/0284398 A1* | 11/2008 | Qiu | H02M 3/156 323/283 |
| 2009/0243580 A1* | 10/2009 | Chen | H02M 3/156 323/288 |
| 2011/0279155 A1 | 11/2011 | Cavallini et al. | |

OTHER PUBLICATIONS

International Search Report and Written Opinion of PCT/EP2015/066912 dated Oct. 19, 2015, all enclosed pages cited.

\* cited by examiner

CIRCUIT FOR CONTROLLING SLEW RATE OF A HIGH-SIDE SWITCHING ELEMENT

FIELD OF THE INVENTION

The present invention relates to a circuit for controlling slew rate of a high-side switching element, in particular an n-channel power metal-oxide-semiconductor field-effect transistor.

BACKGROUND

Power semiconductor devices, such as power metal-oxide-semiconductor field-effect transistors (MOSFETs) and insulated-gate bipolar transistors (IGBTs), can be used as switching elements (or "switches") for switching loads.

A driver circuit is used to apply a signal to a gate of a power semiconductor device so as to switch the device between OFF and ON states. The switching speed of the device (herein referred to as the "slew rate") can be controlled so as to be sufficiently quick to reduce power losses, but slow enough to avoid high-frequency transients which can result in radiative electromagnetic interference.

Figure 1:
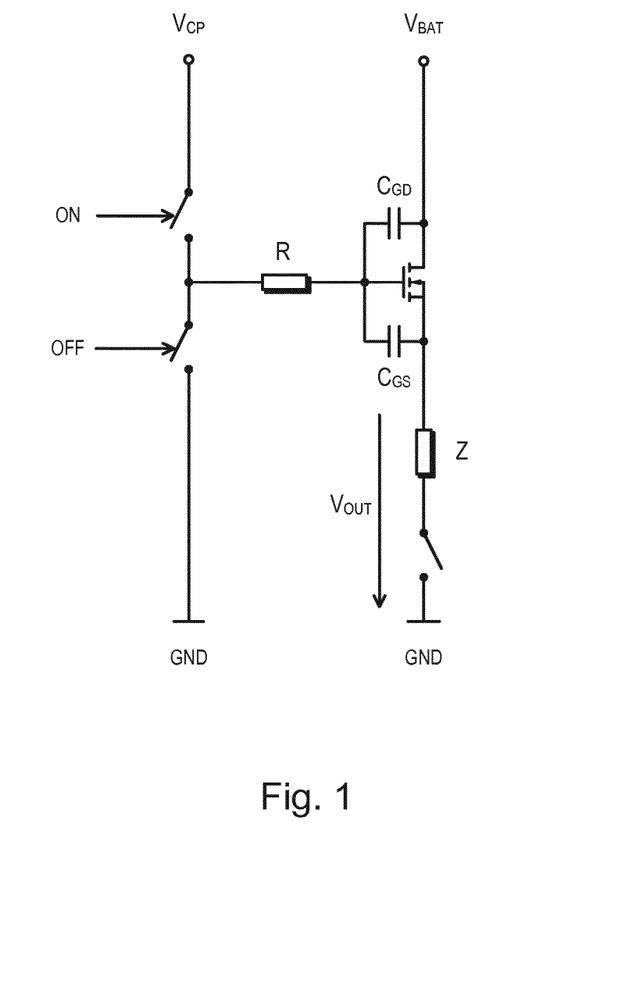
FIG. 1 is a schematic diagram of a first driver circuit and a switching element.

FIG. 1 is a schematic diagram of a first commonly-used driver circuit for a high-side n-channel MOSFET which switches a load, Z. The drain of the MOSFET is tied to a positive voltage source, $V_{BAT}$, and the source is connected to one terminal of the load. The other terminal of the load is tied to ground, GND, via a low-side switching element. The high-side gate driver circuit includes a switchable voltage source coupled to the gate of the MOSFET via a resistor, R. The voltage source can be switched between a positive supply voltage, $V_{CP}$, and ground, GND. Parasitic capacitances include the gate-to-drain capacitance, $C_{GD}$, and a gate-to-source capacitance, $C_{GS}$. The gate-to-drain capacitance, $C_{GD}$, is commonly referred to as the "Miller capacitance". The slew rate depends on the value of the resistor and the Miller capacitance.

Although the first driver circuit is simple and easy to implement, it suffers one or more drawbacks. First, there is no feedback loop and so the driver circuit does not permit the slew rate to be continuously controlled. Furthermore, the resistor is usually a discrete component which can increase the bill of materials. The driver circuit typically has a wide range of slew rates. There are also large time delays resulting from the rise in gate charge $Q_G$ to the onset of the Miller plateau resulting from the Miller capacitance and a slow rate of rise in gate charge $Q_G$ above the onset of the Miller plateau which is caused by the gate-to-drain capacitance, $C_{GD}$.

Figure 2:
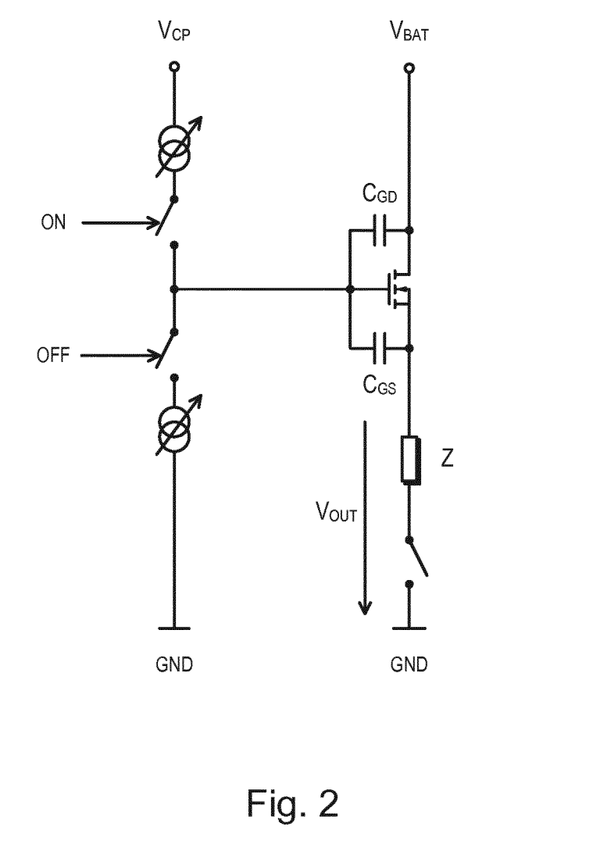
FIG. 2 is a schematic diagram of a second driver circuit and a switching element.

FIG. 2 is a schematic diagram of a second commonly-used driver circuit for a high-side n-channel MOSFET for switching a load.

The second driver circuit uses a programmable current controller. The driver circuit is simple and easy to implement and allows slew rate to be continuously controlled. However, it shares some of the drawbacks of the first driver circuit, such as timing delays.

DE 103 46 307 B3 describes a low-side driver circuit for controlling a low-side MOSFET connected in series with a load. A capacitor is connected between the gate of the MOSFET and ground. However, the driver circuit, like the first commonly-used driver circuit, does not permit the slew rate to be continuously controlled.

U.S. Pat. No. 5,397,967 B describes a high-side gate driver circuit for controlling a high-side field-effect transistor. The circuit includes an operational amplifier whose output is connected to the gate of a field-effect transistor thereby providing a closed loop voltage follower. A capacitor is connected between a non-inverting input of the amplifier and a reference potential or ground. A current source is connected in parallel with the capacitor between the non-inverting input of the amplifier and the reference potential or ground.

Slew rate is controlled by voltage ramp up or down at the input of the closed loop voltage follower. The driver circuit can compensate for parasitic capacitances and tolerate a wide range. Timing can be optimised by reducing start time.

U.S. Pat. No. 6,072,289 B describes a system for controlling slew rate in a motor control circuit for a motor comprises a high-side switching device coupled to a coil of the motor. A high-side slew rate control circuit controls a slew rate of a voltage excitation signal applied to a coil. The slew rate control circuit includes an amplifier having an output coupled to an input of the high-side switching device, a current sink coupling a first input of the amplifier to ground, a capacitor coupling the first input of the amplifier to ground and a feedback path from an output of the high side switching device to a second input of the amplifier.

U.S. Pat. No. 5,589744 B describes a circuit for controlling the slew rate at a motor coil during turn-on in a commutation sequence. The circuit includes a comparator for comparing the output of an error amplifier with the input of an input buffer amplifier. The comparator connects the output of the error amplifier to the input of the buffer amplifier only after the input has been charged at a controlled rate. An integrating buffer amplifier includes an amplifier with a feedback capacitor, and a current source connected at its input, for reducing the voltage slew rate during turn-on of the transistor.

SUMMARY

According to a first aspect of the present invention there is provided a circuit for controlling slew rate of a high-side switching element (such as an nMOS transistor) in a load switch. The circuit comprises a variable current source for setting a slew rate, an amplifier comprising a first input coupled to a reference voltage source, a second input coupled to the variable current source and an output for a signal for driving the switching element. The circuit includes a feedback path from an input terminal, connected or connectable to an output of the switching element, to the second input of the amplifier. The feedback path includes a series voltage-differentiating element, such as a series capacitor.

The circuit, which can be simple and cheap to implement, can be used to set slew rate using the variable current. Thus, slew rate can be varied according to application.

The voltage-differentiating element may be a capacitor.

The switching element may be a transistor, preferably a power transistor. The switching element may be a metal-oxide semiconductor (MOS) field-effect transistor. The switching element may be an nMOS transistor. The switching element may be an insulated gate bipolar transistor (IGBT). The switching element is preferably arranged in a follower configuration.

The circuit may further comprise a circuit for selectively locking the driving signal in a given state, the locking circuit comprising means for determining the state of the signal and means for setting a signal level at the second input to ensure that the state is locked in the given state.

This can help to increase immunity to noise, provide cleaner switch ON and switch OFF and/or, having switched into an ON or OFF state, reduce power loss.

The circuit may further comprise a non-inverting buffer between the output of the differential amplifier and a circuit output connected or connectable to a control electrode of the switching element.

The circuit may further comprise a pre-scaler disposed between the circuit input and the voltage-differentiating element.

According to a second aspect of the present invention there is provided an integrated circuit comprising at least one circuit and control logic configured to set a current for the variable current source for the, or each, circuit.

The integrated circuit may be an application-specific integrated circuit (ASIC).

According to a third aspect of the present invention there is provided a system comprising at least one circuit or integrated circuit and at least one high-side switching element having a control electrode and an output. The, or each, circuit is configured to control a respective switching element whereby the output of the differential amplifier is coupled to the control electrode and the output of the switching element is coupled to the circuit input.

The system may further comprise at least one load, each load connected to a respective switching element. The load may be a stator coil of a motor. The load may be a coil or a relay or solenoid. The load may be a heater element.

The system may comprise two, three or more circuits. Thus, the system can be used to control a multi-phase load, such as three-phase motor.

According to a fourth aspect of the present invention there is provided a method of controlling slew rate of a high-side switching element in a load switch using a circuit, the method comprising setting a current using variable current source.

According to a fifth aspect of the present invention there is provided a computer program which, when executed by a controller, causes the controller to perform the method.

According to a sixth aspect of the present invention there is provided a computer readable medium (which may be non-transitory) carrying or storing the computer program.

BRIEF DESCRIPTION OF THE DRAWINGS

Certain embodiments of the present invention will now be described, by way of example, with reference to FIGS. 3 to 5b of the accompanying drawings, in which.

DETAILED DESCRIPTION OF CERTAIN EMBODIMENTS

Figure 3:
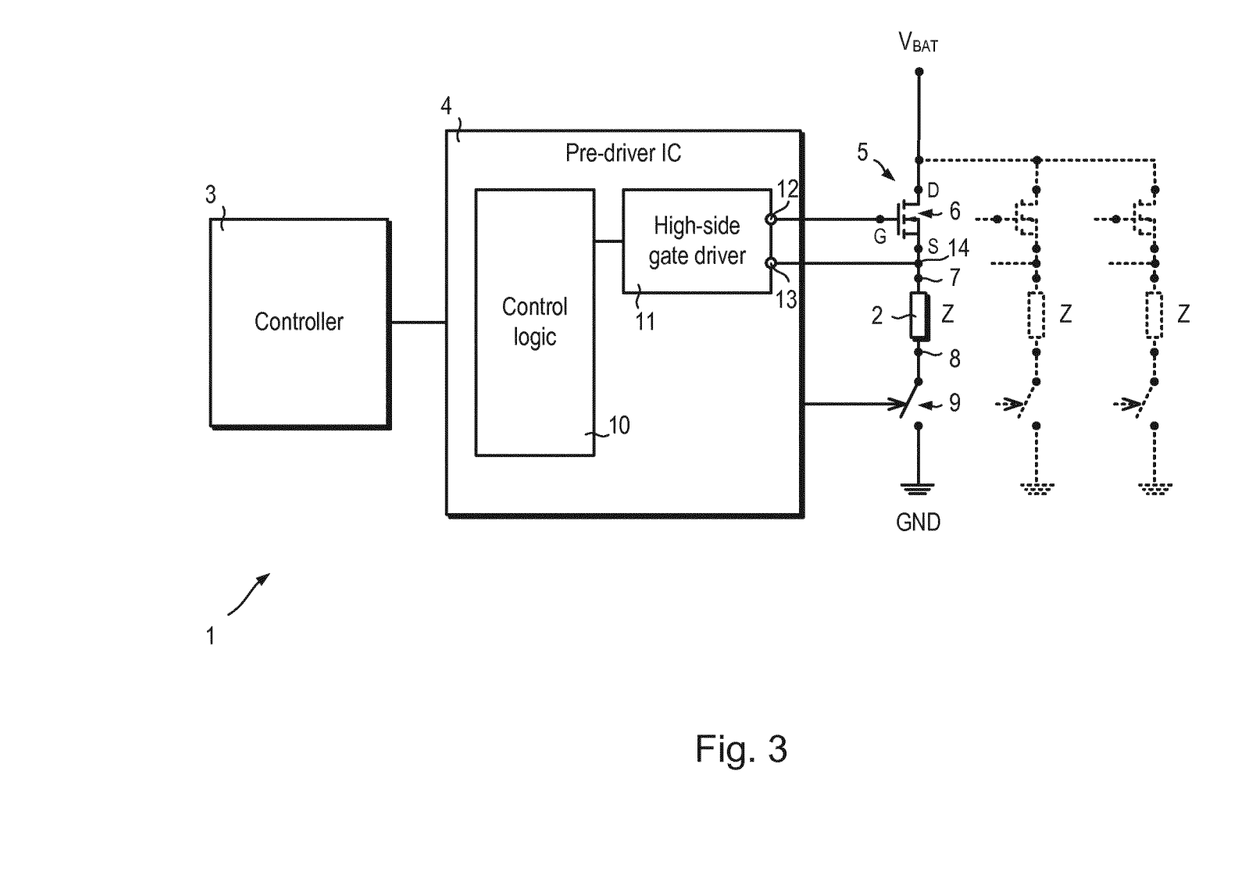
FIG. 3 is a block diagram of a system for controlling and driving one or more loads.

Referring to FIG. 3, a system 1 for controlling and driving one or more loads 2 is shown. A load 2 may be, for example, a coil in motor, a coil in a solenoid or relay, a heater element or other form of a load having a complex impedance Z. The system 1 can be used for controlling a three-phase motor, that is, a motor having three loads 2, or other type of multi-phase device.

The system 1 includes a controller 3, such as a microcontroller, a pre-driver integrated circuit (IC) 4 and a load switch 5 for the, or each, load 2.

A load switch 5 includes a high-side switching element 6 in the form of an n-channel, power metal-oxide-semiconductor field-effect transistor (MOSFET) (herein also referred to as an "nMOSFET" or simply "nMOS transistor").

The nMOS transistor 6 may be a discrete component or may be integrated into a load switch IC or into the pre-driver IC 4. The nMOS transistor 6 is configured as a source follower. The drain D of the nMOS transistor 6 is tied to a positive voltage supply, $V_{BAT}$, from a battery (not shown) and the source S is connected to a first, supply-side terminal 7 of the load 2. A second terminal 8 of the load 2 is connected to ground, GND, via a low-side switching element 9. The positive voltage supply need not be provided by a battery, but can be provided from a mains supply or other type of supply.

The pre-driver IC 4 includes control logic 10 and a high-side gate driver circuit 11. The high-side driver circuit 11 has a driver output 12 which is connected to the gate G of the nMOS transistor 6 and a feedback input 13 which is connected to a tap 14 at or between the source S of the nMOS transistor 6 and the supply-side terminal 7. The tap 14 measures the output of the nMOS transistor 6, i.e. a driver output voltage, $V_{OUT}$, which appears across the load 2.

Figure 4:
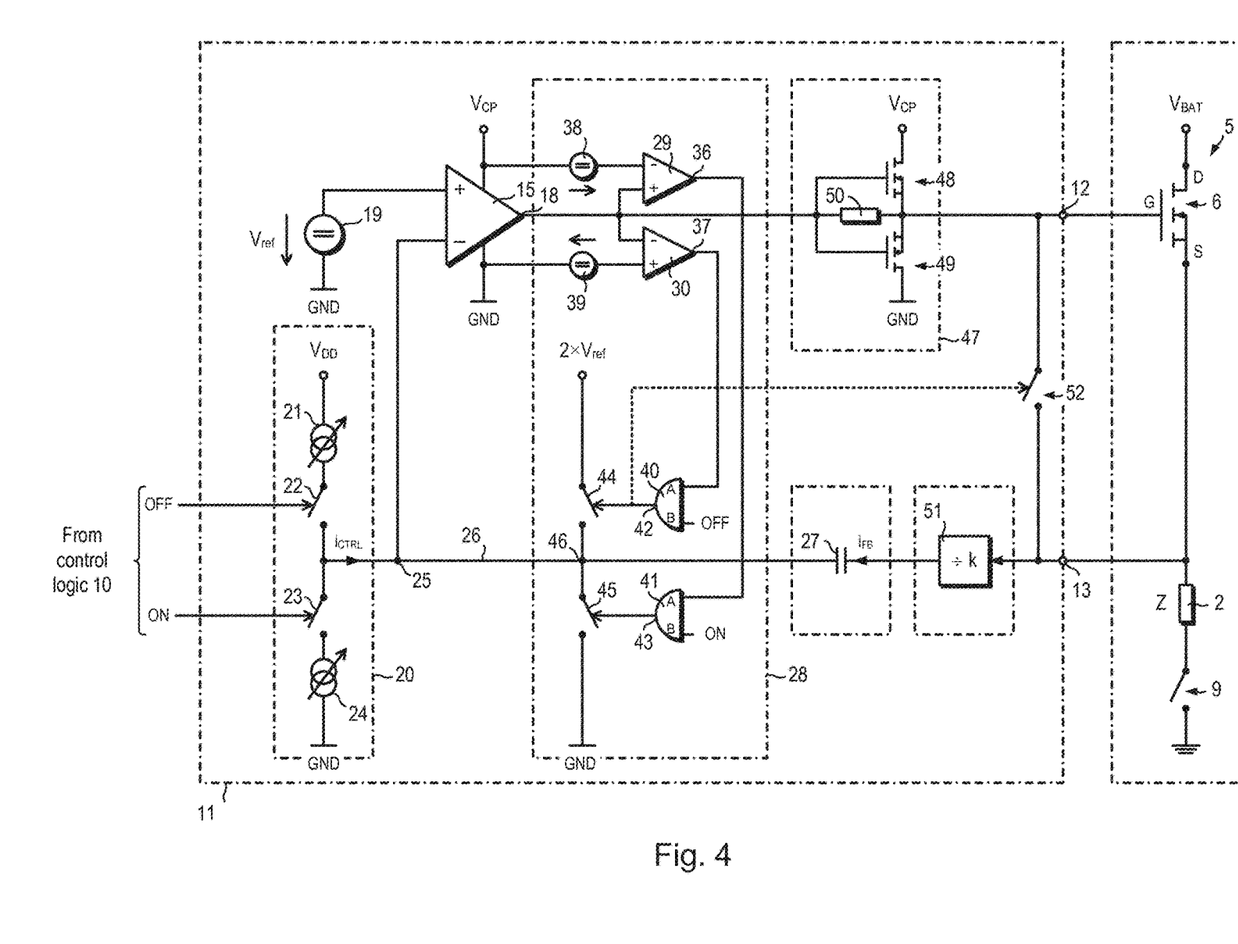
FIG. 4 is a schematic diagram of a load, a load switch and a high-side gate driver circuit.

Referring to FIG. 4, a load 2, a load switch 5 and a high-side gate driver circuit 11 are shown in more detail.

As explained earlier, the drain D of the nMOS transistor 6 is tied to the positive voltage supply, $V_{BAT}$, and the source S is connected to a first terminal 7 of the load 2. A second terminal 8 of the load 2 is connected to ground, GND, via a low-side switching element 6.

The nMOS transistor 6 is driven by a differential amplifier 15 (herein referred to as the "driving differential amplifier") having non-inverting and inverting inputs and an output 18.

A voltage source 19 is connected between ground and the non-inverting input of the amplifier 15 and provides a fixed reference voltage, $V_{ref}$, to the driving differential amplifier 15.

The high-side gate driver circuit 11 includes a programmable current source 20 which is controlled by control logic 10 (FIG. 3). The programmable current source 20 comprises a first current source 21, a first switch 22, a second switch 23 and a second current source 24 arranged between supply line, $V_{DD}$, and ground, GND. The programmable current source 20 is capable of providing variable currents having positive and negative slopes. The programmable current source 20 provides a control current, $i_{CTRL}$, to the inverting input of the driving differential amplifier 15 via node 25.

The high-side gate driver circuit 11 includes a feedback path 26 between the feedback input 13 and the inverting input of the driving differential amplifier 15 via node 25. The path 26 includes a series voltage-differentiating element 27. The voltage differentiating element 27 takes the form of a capacitor 27. However, other forms of voltage-differentiating element 27 can be used, such as a signal processor (not shown). Using a signal processor (not shown) as a voltage-differentiating element 27 can allow the properties of the voltage-differentiating element 27 to be varied.

The high-side gate driver circuit 11 may include an optional circuit 28 for selectively locking the drive signal at the output 18 to HIGH, i.e. ON, or LOW, i.e. OFF. The level locking circuit 28 includes first and second differential amplifiers 29, 30 having respective non-inverting and inverting inputs and respective outputs 36, 37. Each non-inverting input is connected to the output 18 of the differential amplifier 15 and each inverting input is connected to a respective voltage source 38, 39. The voltage source 38, 39 provide damping thresholds for ON and OFF states respectively. The clamping threshold of the first voltage source 38 is just below, e.g. of the order of 100 mV, below the ON voltage level and the clamping threshold of the second voltage threshold 39 is just above, e.g. of the order of 100 mV, above the OFF voltage level. The first and second differential amplifiers 29, 30 are used to determine whether the drive signal is ON or OFF respectively.

The lock circuit 28 includes first and second two input AND gates 40, 41. The outputs 36, 37 of the first and second differential amplifiers 29, 30 are connected to respective first inputs of the AND gates 40, 41. The control logic 10 (FIG. 3) provides control signals OFF, ON to respective second inputs of the AND gates 40, 41. The AND gates 40, 41 have respective outputs 42, 43 control first and second switches 44, 45 arranged in totem pole configuration between a positive supply rail, $2 \times V_{ref}$, and ground, GND and having a tap 46 connected to the feedback path 26 between the capacitor 27 and the node 25. $V_{ref}$ can be, for example, the band gap voltage, around 1.2 V. However, $V_{ref}$ can take other values.

The high-side gate driver circuit 11 may include an optional non-inverting buffer 47 between the output 18 of the driving differential amplifier 15 and the drive output 15. The non-inverting buffer 47 may comprise an nMOS transistor 48 and a pMOS transistor 49 arranged in a push-pull configuration between positive supply rail, $V_{CP}$, and ground, GND. The non-inverting buffer 47 includes a resistive bypass 50 to help finally establish the correct gate voltage. The resistive bypass 50 takes the form of a resistor.

The high-side gate driver circuit 11 may include an optional pre-scaler 51 connected between the feedback input 13 and capacitor 27. The pre-scaler 51 can be used to step down the driver output voltage, $V_{OUT}$. The pre-scaler 51 can take the form of a voltage divider.

The high-side gate driver circuit 11 may also include a switch 52 between the driver output 12 and feedback input 13. The switch can be used to help ensure a low-value ohmic gate short for improved EMC immunity. The switch 52 can take the form of a nMOS gate-source. The switch can be controlled by gate output 42.

Operation

Referring to FIGS. 3, 4, 5a and 5b, slew rate control will now be described in more detail.

The controller 3, via the pre-driver control logic 10, is used to set a desired slew rate. The desired slew rate depends on use and type of load (e.g. motor coil, heater element etc.) and involves considering electromagnetic emission levels and power consumption.

During turn on, the driver output voltage, $V_{OUT}$, is given by equation (1) below, namely $$V_{OUT} \approx (1/C_{FB}) \int i_{CTRL} dt \qquad (1)$$

While a control current, $i_{CTRL}$, is supplied, a drive signal is applied to the gate of the nMOS transistor 6 and gate charge $Q_G$ increases. The rate of change of driver output voltage, i.e. slew rate, can be approximated by equation (2) below, namely:

$$dV_{OUT}/dt \approx (1/C_{FB}) i_{CTRL} \qquad (2)$$

Even though the value of the capacitor 27 is fixed, the slew rate can be set using programmable current source 20. If a signal processor or other form of variable and/or programmable voltage-differentiating element 27 is used, then the value of capacitance $C_{FB}$ need not be fixed and so slew rate can be variably set using the voltage-differentiating element 27.

Figure 5A:
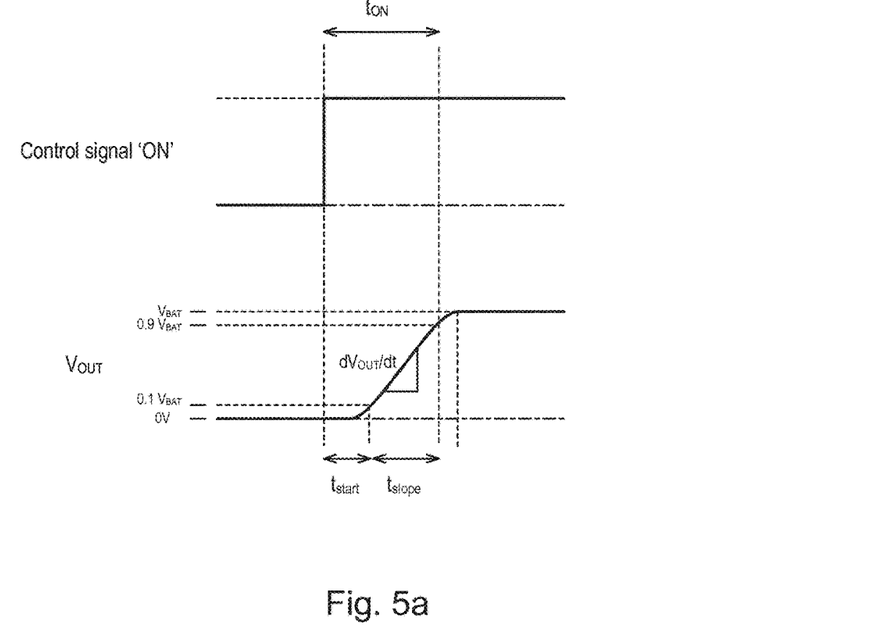
FIGS. 5a and 5b are timing charts schematically illustrating variation in output voltage across a load with time using the high-side gate driver circuit shown in FIG. 4.
Figure 5B:
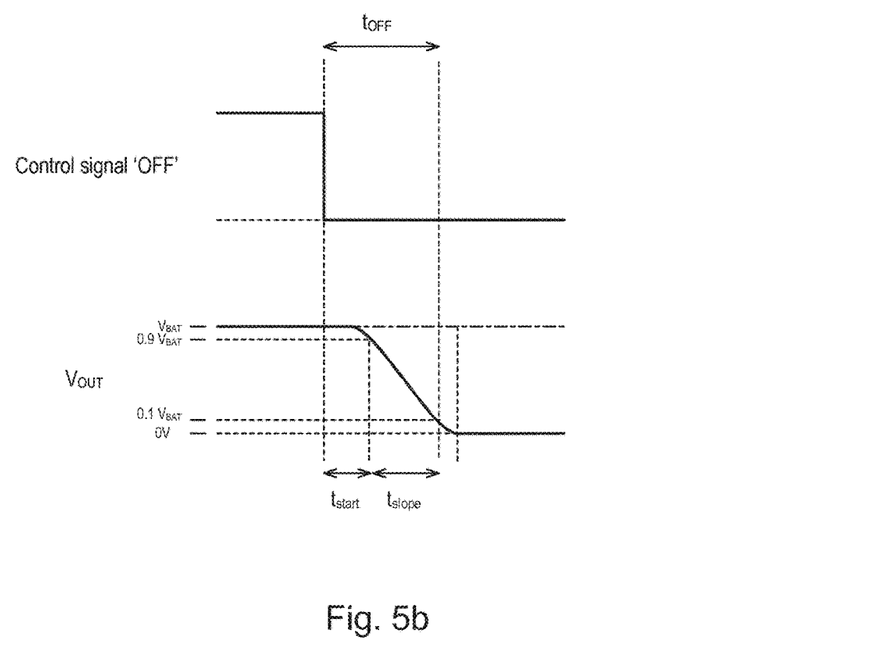

FIGS. 5a and 5b schematically illustrate behaviour of the driver output voltage, $V_{OUT}$, on control signals OFF and ON from control logic 10.

Referring to FIGS. 3, 4 and 5a, the control logic 10 switches the control signal ON from LOW to HIGH. This causes the programmable current source 20 to provide a positive control current, $i_{CTRL}$, to the inverting input of the driving differential amplifier 15. There is a propagation delay, $t_{start}$, before the driver output voltage, $V_{OUT}$, starts to rise to 10% of the positive supply rail voltage, $V_{BAT}$. Thereafter, the rate of increase in output voltage, $V_{OUT}$, is defined by $(1/C_{FB}) i_{CTRL}$. The output voltage reaches 90% of the positive supply rail voltage, $V_{BAT}$, after an elapsed time, $t_{slope}$.

If a locking circuit 28 is used, then once the differential amplifier output 18 exceeds the upper clamping threshold voltage level, then the circuit 28 locks the output 18 and, thus, the driver output voltage, $V_{OUT}$.

The control logic 10 can then switch the control signal ON from HIGH to LOW.

A similar process is used to switch the load switch 5 off.

Referring to FIGS. 3, 4 and 5b, the control logic 10 switches the control signal OFF from LOW to HIGH. This causes the programmable current source 20 to provide a negative control current, $i_{CTRL}$, to the inverting input of the driving differential amplifier 15. There is a propagation delay, $t_{start}$, before the driver output voltage, $V_{OUT}$, starts to fall by 10%. Thereafter, the rate of decrease in output voltage, $V_{OUT}$, is defined by $(1/C_{FB}) i_{CTRL}$. The output voltage reaches 10% of the positive supply rail voltage, $V_{BAT}$, after an elapsed time, $t_{slope}$.

If a locking circuit 28 is used, then once the differential amplifier output 18 falls below the upper clamping threshold voltage level, then the circuit 28 locks the output 18 and, thus, the driver output voltage, $V_{OUT}$.

The control logic 10 can then switch the control signal OFF from HIGH to LOW.

If the system 1 includes a multi-phase device having multiple loads 2, then a high-side gate driver circuit 11 is provided for each switching element 5. Thus, for a three-phase motor, three high-side gate driver circuits 11 are provided. Multiple gate drivers 11 may be provided in the same pre-driver IC 4. Each gate drivers 11 may be provided with respective control logic Do or may share the same control logic 10.

The high-side gate-driver 11 can have one or more advantages.

The high-side gate-driver 11 is less susceptible to variations in nMOS transistor parameters and ratings and so can be used with a wider variety of nMOS transistors. It can also be used with wider variety of switched loads. Through the variable current source 20, the slew rate can be programmed according to a particular application and can be adjusted according to load conditions taking into account, for example, as load impedance, battery voltage and driver transistor parameters. The high-side gate-driver 11 can be easily implemented in a pre-driver IC. Compared to known standard gate current controlled driver solutions the invention optimizes the non-overlapping timing in a bridge configuration and hence the power efficiency.

It will be appreciated that many modifications may be made to the embodiments hereinbefore described.

Other switching elements 6 capable of follower-type behaviour can be used, i.e. where an output node of the switching element 6 follows an input node of the switching element 6. For example, an IGBT may be used.

A switch load may include a low-side, n-MOS transistor and the pre-driver IC 4 may include a low-side gate driver for the low-side n-MOS transistor.

The invention claimed is:

1. A integrated circuit comprising:
    at least one slew-rate controlling circuit, each slew-rate controlling circuit comprising:
    a variable current source for providing a control current for setting a slew rate of a high-side switching element in a load switch, the variable current sourse comprising first and second current sources;
    a differential amplifier comprising:
        a first input coupled to a reference voltage source;
        a second input coupled to the variable current source; and
        a differential output for a signal for driving the switching element; and
    a feedback path from a circuit input, connected or connectable to an output of the switching element, to the second input of the amplifier, the feedback path including a series voltage-differentiating element,
    wherein the first and second current sources are viable current sources and the variable current source is a programmable current source controllable by control logic to allow the slew rate of the high-side switching element to be varied according to application and adjusted according to load conditions; and
    the control logic configured to set the control current for the variable current source.

2. An integrated circuit according to claim 1, wherein the voltage-differentiating element is a capacitor.

3. An integrated circuit according to claim 1, wherein the switching element is an MOS transistor.

4. An integrated circuit according to claim 1, wherein the switching element is an nMOS transistor.

5. An integrated circuit according to claim 1, further comprising:
    a non-inverting buffer between the output of the differential amplifier and a circuit output connected or connectable to a control electrode of the switching element.

6. An integrated circuit according to claim 1, further comprising:
    a pre-scaler disposed between the circuit input and the voltage-differentiating element.

7. A system comprising:
    an integrated circuit according to claim 1; and
    at least one high-side switching element having a control electrode and an output, wherein each circuit is configured to control a respective switching element whereby the output of the differential amplifier is coupled to the control electrode and the output of the switching element is coupled to the circuit input.

8. A system according to claim 7, further comprising:
    at least one load, each load connected to a respective switching element.

9. A system according to claim 8, wherein the load is stator coil of a motor.

10. A system according to claim 7, wherein the system comprises three each slew-rate controlling circuits.

11. A method of controlling slew rate of a high-side switching element in a load switch using an integrated circuit according to claim 1, the method comprising:
    setting the control current using the variable current source.

12. A computer program product comprising a non-transitory computer-readable medium carrying or storing a computer program which, when executed by a controller, causes the controller to perform the method of claim 11.

13. An integrated circuit according to claim 1, which is an application-specific integrated circuit.

14. A circuit for controlling slew rate of a high-side switching element in a load switch, the circuit comprising:
    a variable current source for setting a slew rate;
    a differential amplifier comprising;
        a first input coupled to a deference voltage source;
        a second input coupled to a reference voltage source; and
        an output for a signal for driving the switching element, and
    a feedback path from a circuit input, connected or connectable to an output of the switching element, to the second input of the amplifier, the feedback path including a series voltage-differentiating element, and
    a circuit for selectively locking the driving signal in a given state, the circuit comprising differential amplifiers for determining the state of the signal and gates and switches for setting a signal level at the second input to ensure that the state is locked in the given state.

15. A circuit according to claim 14, further comprising:
    a non-inverting buffer between the output of the differential amplifier and a circuit output connected or connectable to a control electrode of the switching element.

16. A circuit according to claim 14, further comprising: a pre-scaler disposed between the circuit input and the voltage-differentiating element.

17. A circuit according to claim 14, which is an application-specific integrated circuit.

18. A system comprising:
    at least one circuit according to claim 14, and
    at least one high-side switching element having a control electrode and an output, wherein each circuit is configured to control a respective switching element whereby the output of the differential amplifier is coupled to the control electrode and the output of the switching element is coupled to the circuit input.

19. A system according to claim 18, further comprising: at least one load, each load connected to a respective switching element.

20. A system according to claim 18, wherein the system comprises three each slew-rate controlling circuits.

* * * * *